United States Patent [19]

Wierec et al.

[11] Patent Number: 4,758,928
[45] Date of Patent: Jul. 19, 1988

[54] MECHANICAL INTERLOCK ARRANGEMENT FOR PREVENTING MISINSTALLATION OF PC BOARDS IN AN ASSOCIATED MAINFRAME CHASSIS

[75] Inventors: Michael R. Wierec, Palatine; Donald J. Zito, Bartlett, both of Ill.

[73] Assignee: Motorola, Inc., Schaumburg, Ill.

[21] Appl. No.: 77,832

[22] Filed: Jul. 27, 1987

[51] Int. Cl.⁴ .............................................. H05K 7/02
[52] U.S. Cl. .................................... 361/415; 211/41; 361/399; 361/394; 439/76
[58] Field of Search ........................ 361/415, 399, 394; 439/59, 66, 78, 76, 133, 304; 211/41

[56] References Cited

U.S. PATENT DOCUMENTS

| | | | |
|---|---|---|---|
| 2,958,014 | 10/1960 | Blain | 361/415 |
| 3,603,845 | 9/1971 | Beers | 361/399 X |
| 3,818,280 | 6/1974 | Smith et al. | 361/415 X |
| 3,904,937 | 9/1975 | Levin | 361/415 X |
| 4,377,315 | 3/1983 | Grau | 439/59 |
| 4,434,537 | 3/1984 | Bean et al. | 361/399 X |
| 4,542,441 | 9/1985 | Perretta | 361/415 X |
| 4,547,835 | 10/1985 | Pansaerts et al. | 361/415 X |
| 4,630,175 | 12/1986 | Lerude et al. | 361/415 X |

Primary Examiner—R. R. Kucia
Attorney, Agent, or Firm—Donald B. Southard; Anthony J. Sarli, Jr.

[57] ABSTRACT

A mechanical interlock arrangement is disclosed for preventing misinstallation of a plurality of associated PC boards in the mainframe chassis of an electrical or electronic apparatus. Each PC board is mounted to a subpanel which has a mounting flange with a uniquely located key tab. This keying tab is accommodated within a selectively located slot on a member positioned traverse the front face of the mainframe chassis. The keying tab may be located along the top or bottom of the mounting flange and is made of substantially rigid material to prevent such protective keying function from being easily defeated.

14 Claims, 3 Drawing Sheets

MECHANICAL INTERLOCK ARRANGEMENT FOR PREVENTING MISINSTALLATION OF PC BOARDS IN AN ASSOCIATED MAINFRAME CHASSIS

The present invention relates generally to keying or interlock arrangements and more particularly to a mechanical interlock arrangement for use with PC Boards to effectively prevent misinstallation thereof in an associated mainframe chassis.

PC boards are frequently mounted edgewise into a receiving chassis frame to comprise an overall electrical or electronic apparatus. Frequently the PC boards include a subpanel which in combination with other such subpanel assemblies form the complete front panel of the apparatus as well as providing the electronic circuitry for effecting the intended function thereof.

The PC boards are normally of identical size and physical configuration and profile for cost effectiveness, but include differing circuitry to effect different electrical functions. Since each such PC board has a unique function, it must necessarily be installed in its proper location within the associated mainframe, or card cage, chassis. In other words, there is only one location that such PC board can function properly. Accordingly, there is a need to prevent the various PC boards from being installed or inserted in a wrong location. For the most part, however, such prior arrangements to effect this end have not proven entirely satisfactory in terms of reliability, cost effectiveness, or other factors, such module or component damage.

One such prior structure that has found wide usage is shown in FIG. 2. A PC board includes a forward portion containing conductors at the edge thereof which mate with like conductive strips in an associated electrical socket as shown, which in turn is mounted within the associated mainframe chassis. To insure that only the right PC board is installed, a small key insert or tab, usually plastic, is included in the electrical socket at the location to mate with a complementary slot included in the PC board itself at that location. Other PC boards have the slot and the associated insert within the electrical connectors at still different but complementary locations.

There are a number of aspects with the foregoing structure that are found to be deficient. There is an inherent manufacturing error associated with inserting the plastic tab or insert in the wrong location within the connector. There is no visual indication of any source of interference. As a consequence, one inserting the board may well interpret any resistance encountered as being normal with respect to insertion friction and simply push harder, thereby damaging the board and/or connector and its associated keying apparatus. It should also be noted that there is no audible indication as well when the PC board is attempted to be inserted in a wrong location. Another deficiency is that the plastic tab or insert is prone to falling out thereby rending the protective keying feature completely inoperative. Finally, along the same lines, the protective keying mechanism can easily be defeated by merely removing this protective tab. It is not uncommon for a service person or technician to do just that and then forget to replace the same when such servicing or maintenance operation is completed.

What is needed then is a simple, but reliable mechanical interlock arrangement for effectively and efficiently preventing misinstallation of PC boards in locations within the mainframe chassis. It should be fail safe in operation and be reasonably immune from intentional defeat or otherwise by service personnel and/or others with access thereto. And it should preferably provide both visual and audible indication of incorrect insertion is attempted with any of the individual PC boards.

SUMMARY OF THE INVENTION

It is an object of the present invention to provide a mechanical interlock arrangement for insuring correct installation of PC boards within a mainframe chassis that overcomes the deficiencies of the prior structures as above referenced.

A more particular object of the present invention is to provide a mechanical interlock arrangement of the foregoing type with a protective keying feature that cannot be easily defeated, is simple but reliable in operation, and provides both visual and audible indication when incorrect insertion of an associated PC board is attempted.

In one embodiment of the invention, a mechanical interlock arrangement is provided for preventing misinstallation of a plurality of PC boards in a mainframe chassis of an associated electrical/electronic apparatus. To this end, a plurality of subpanels are provided which includes a mounting flange affixed thereto and to which a PC board is mounted. A keying tab of rigid material is included that extends inwardly, essentially orthogonal to the plane of the subpanel.

This keying tab matches and is accommodated within a slot selectively located in a member extending traversely across the front of the mainframe chassis. There are a number of such selectively located slots which insure that a PC board will be inserted fully into an electrically activated only if the associated keying tab mates with an appropriate selectively located slot on the mainframe chassis.

The keying tab is of rigid material and cannot be easily defeated or otherwise distorted to ensure the protective keying feature at all times.

BRIEF DESCRIPTION OF THE DRAWINGS

The features of the present invention which are believed to be novel are set forth with particularity in the appended claims. The invention, itself, together with further objects and advantages thereof may best be understood by reference to the following description when taken in connection with the accompanying drawings, in which:

DESCRIPTION OF THE PREFERRED EMBODIMENT

Figure 1:
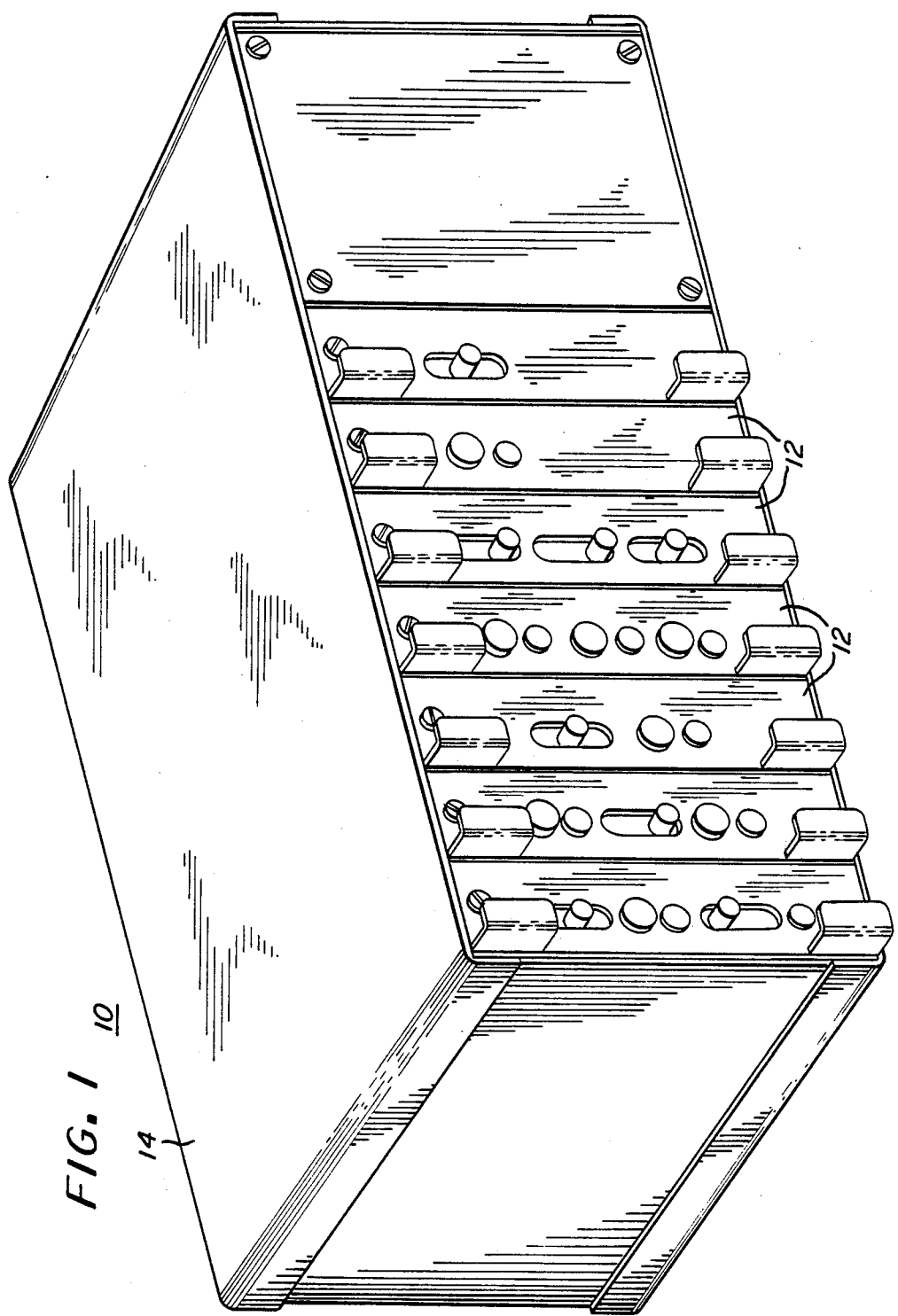
FIG. 1 is a view in perspective of an electrical apparatus including subpanels with associated PC boards attached thereto inserted within the mainframe chassis of the apparatus.

Referring now to the drawings, an electrical/electronic apparatus 10 is illustrated in FIG. 1 of the type which includes a plurality of integrated subunits or panel assemblies 12. These subpanel assemblies, are collectively housed in the housing 14 and individually include a PC board 16 (best seen in FIG. 3) affixed to a subpanel 18. These subpanel assemblies with attached PC board are inserted edgewise into the housing 14 and are held in place by and in cooperation with a mainframe or cardcage chassis 20.

The subpanel assembly units 12 include PC boards 16 which are all of like size and physical configuration or profile so that they fit within any of the plurality of locations in the mainframe chassis. This optimizes cost effectiveness in terms of design, assembly and like factors. However, since the PC boards all include differing circuitry to provide different intended functions, there is only one proper location for each in the mainframe chassis. Accordingly, a provision must be made to insert such subassembly and associated PC board into its proper location and no other.

Figure 2:
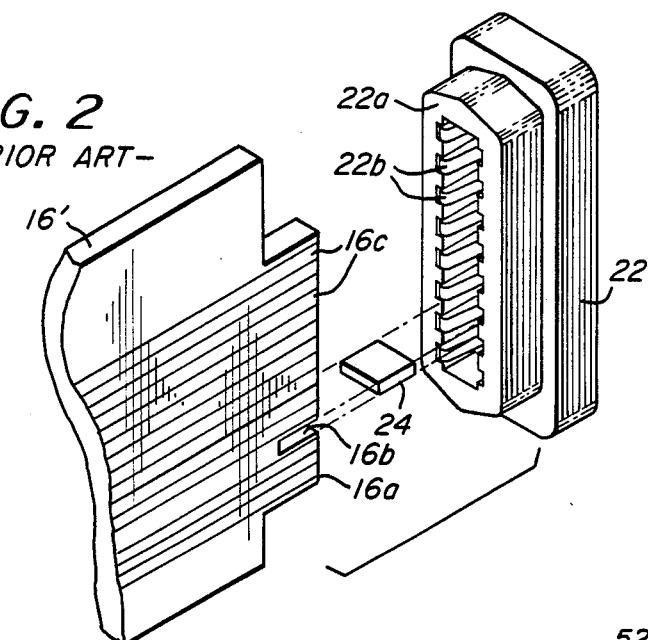
FIG. 2 is an enlarged fragmentary view of a prior art arrangement for preventing misinsertion of a PC board into a mainframe chassis as shown in FIG. 1.

As mentioned previously, one such prior structure designed to effect this purpose is shown in FIG. 2. The PC board 16' has a forward portion 16a on which are included edge conductors 16c and a slot 16b at a given location, as shown. An associated electrical conductor 22 is illustrated which is attached to the inner back wall (not shown) of the mainframe chassis 20. The connector 22 includes and open cavity or receptacle 22a within which are positioned edge conductors 22b. The forward portion 16a of PC board 16' inserts within cavity 22a with the edge conductors 16c placed in electrical contact with conductors 22b. Finally, to ensure that only the particular PC board 16' may be inserted within this particular electrical connector, an insert or tab 24, usually plastic, is positioned within the receptacle cavity 22a at a location which aligns with the slot 16b of PC board 16'.

As also mentioned previously, such prior techniques and structure has significant advantages, not the least of which is its susceptibility to being intentionally defeated by simply removing the keying tab 24. Of concern also is the fact that the keying of the PC board slot 16b to the keying tab 24 must be effected blindly in the interior of the mainframe chassis without visual or audible observation or feedback. The structural elements are for the most part rather fragile and susceptible to damage by breakage or the like.

All the foregoing deficiencies are effectively overcome in the present invention which provides a new and improved keying mechanism to prevent the desired misinstallation on insertion of the associated PC boards in the mainframe chassis, but accomplishes this function in a simple and more reliable manner. Moreover the protecting keying feature cannot be easily defeated and any interference encountered by reason of incorrect insertion is both visually and audibly reinforced.

Figure 4:
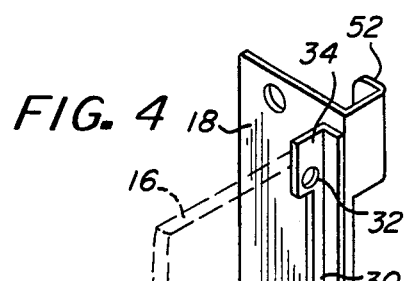
FIG. 4 is a view in perspective of the mounting flange for attachment to a subpanel and to which an associated PC board is attached thereto.
Figure 3:
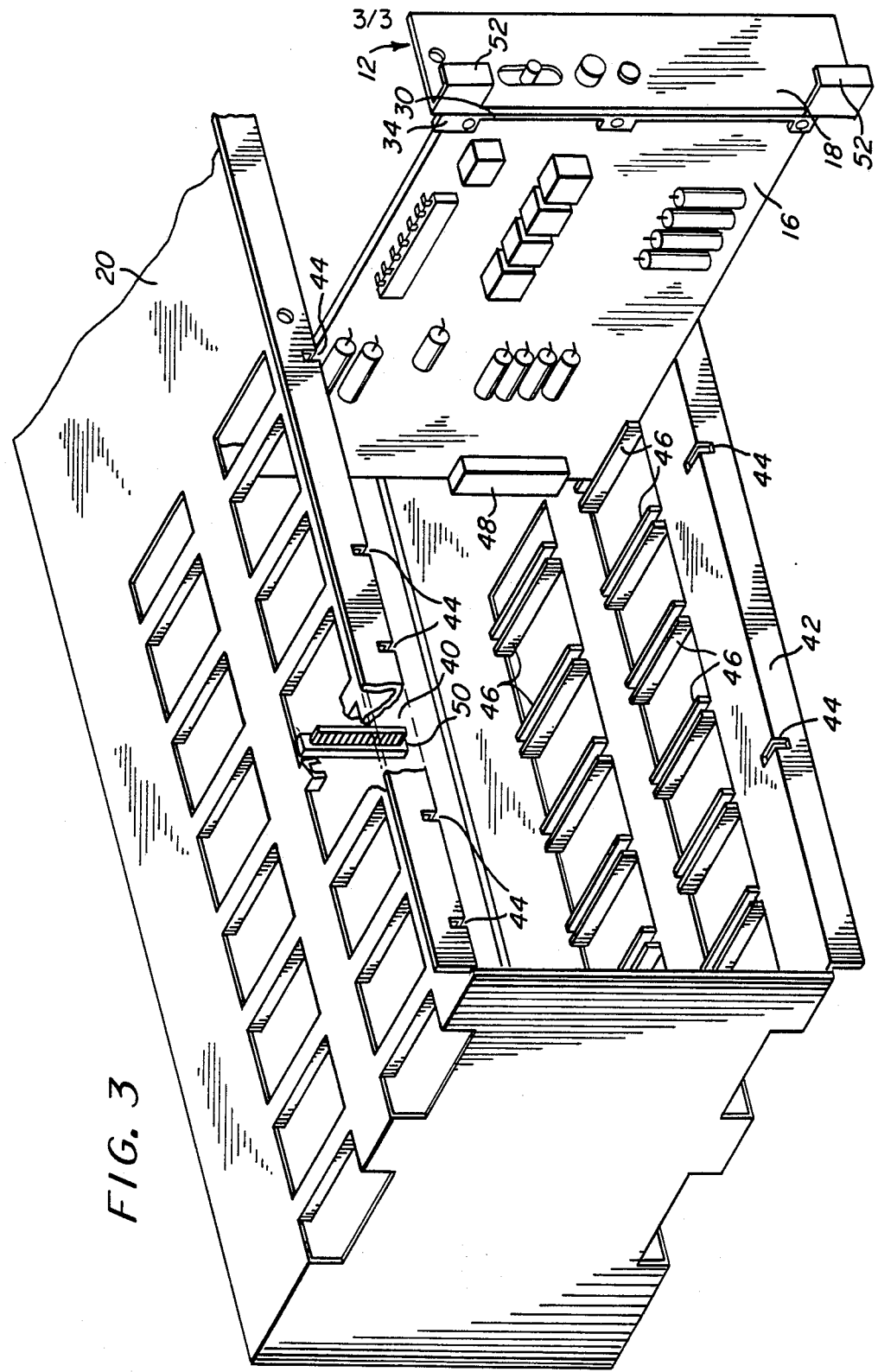
FIG. 3 is a graphic representation in perspective which prevents misinsertion of an associated PC board which arrangement has been constructed in accordance with the present invention.

Referring to FIG. 3, the present invention encompasses a mounting flange 30 affixed to the backside of subpanel 18 and to which the PC board 16 is affixed, such as by mounting screws (not shown) cooperating with suitably threaded openings 32 in flange 30 (best seen in FIG. 4). This flange 30 further includes a keying tab 34 at either the top or the bottom, or both. It is shown in FIGS. 3 and 4 at the top for convenience only.

The mounting flange 30 and the associated tab 34 are constructed of a rigid material, such as sheet metal, plastic or other suitable material, preferably in a one-piece construction, although it is to be understood that the invention is not to be so limited.

On the main frame chassis 20, top and bottom members 40 and 42 extend traversely along the front face thereof. Individual slots 44 are included in such members at selected locations, as shown. These slots are dimensioned and located to accept only a particular one of the keying tabs 34 associated with a particular subpanel assembly unit 12.

In operation, PC board 16 is placed edgewise into the mainframe chassis 20 at a location wherein the top and bottom edges thereof fit within the provided channel tracks 46 located along the interior of the bottom and top walls. The board 16 may then be pushed inwardly to a position whereby the electrical connector 48 mounted at the end of PC board 16 is positioned adjacent and aligned with a corresponding electrical connector 50 mounted on the back wall of chassis 20. One of these connectors may be a female type and the other a male type. Then, in the last stage of assembly, if the keying tab 34 is aligned with a corresponding slot 44 on one of the members 40, 42, then PC board 16 and associated subpanel assembly 18 may be moved to a final position whereby connector 48 mates with connector 50 and panel 18 is flush with members 40 and 42. In such position, PC board 16 is in a position to be electrically activated and subpanel assembly 12 then forms a part of the front panel of apparatus 10, best seen in FIG. 1. Subpanel assembly 12 may further include one or more handles 52 with which to facilitate the installation or removal of the subpanel assembly 12 from mainframe chassis 20.

It is to be emphasized that subpanel assembly unit 12 may be moved to its final and fully inserted, electrically operative position only if the associated keying tab 34 matches and is accommodated within the selectively located slot 44 on either member 40 or 42. When a particular subassembly 18 is attempted to be installed or inserted in an undesired, i.e., wrong, location, not only is a visual indication effected by the mismatch between tab and slot, since they are fully exposed to the observer, but an audible indication is also produced by reason of a hard surface-to-surface contact that occurs. Moreover, this protective keying arrangement is impossible to override since heavy gauge steel from which the mounting flange is formed is most difficult to bend or otherwise move. For all practical purposes, the foregoing effectively prevents the possibility of inserting an associated PC board into an incorrect location and attendant misconnection and possible component damage.

A significant feature of the present invention is that the protective keying may be effected on the top, in conjunction with member 40 or on the bottom, with member 42, or possibly both. With alternate top or bottom keying selected, only half as many mounting flanges are necessary with unique keying features. That is, each mounting flange with a particular keying tab orientation, such as at 34, will provide two different and distinctive keying functions. One is where the tab 34 is located on the top and mates with a corresponding slot 44 in number 40 and still a different keying function is effected when the tab is located on the bottom which will then have to mate with a corresponding slot 44 on the member 42.

In this way, it will be noted that each PC board mounting flange 30 may be formed with two unique keying tab positions. One top and one bottom, by the orientation of the forming of the flange. That is, by "forming right" the keying tab would be on the top of mounting flange 30, as shown in FIG. 4. Forming left will then place the tab on the bottom. The mounting flange blank, however, remains the same for both.

Figure 5A:
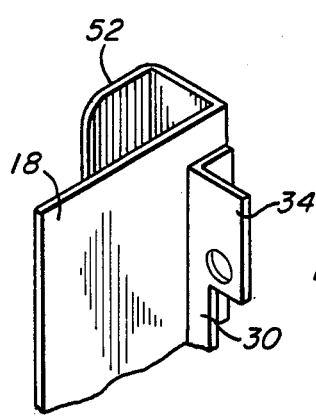
FIG. 5 includes an enlarged fragmentary views in perspective of mounting flanges with different keying tabs which provide the protective keying feature of the present invention.
Figure 5B:
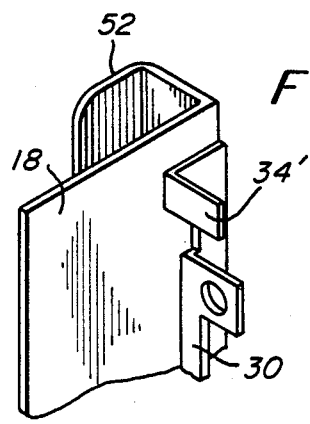
Figure 5C:
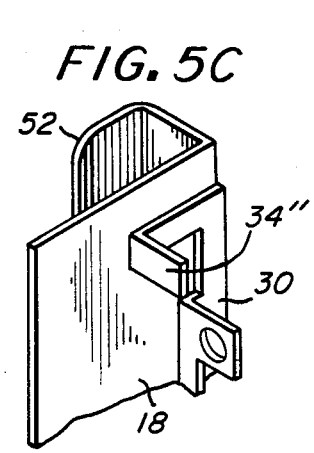

Additional keying functions are effected by offsetting the keying tab in the flange 30. FIG. 5 shows three different positions for the keying tab, identified at 34, 34′ and 34″. By forming both left and right, a total of six completely unique keying functions are then provided.

Accordingly, an improved mechanical interlock arrangement has been disclosed herein which is highly reliable, comprised of inexpensive component parts, and is superior to previous keying arrangements in that it provides a positive interference with metal-to-metal or other hard surface-to-surface contact that is conveniently verifiable visually as well as audibly when an attempt is made to incorrectly insert an associated PC board. Such protective keying cannot be easily defeated and is very cost effective since a single mounting flange blank provides two different, i.e., top and bottom, keying functions.

What is claimed is:

1. A mechanical interlock arrangement for preventing misinstallation of a plurality of associated PC (printed circuit) boards in a mainframe chassis of an electronic apparatus, comprising in combination:
   a subpanel with a mounting flange attached thereto to which an associated PC board may be mounted to form a subpanel assembly unit, each such flange including at least one keying tab extending essentially orthogonal to the plane of said subpanel; and
   at least one member located traverse of the mainframe chassis which includes slots selectively located therein for accepting PC boards in the fully inserted position within the mainframe chassis only if each such boards includes a keying tab that is positioned to and mates with a corresponding slot selectively located in the mainframe chassis.

2. A mechanical interlock arrangement in accordance with claim 1 wherein said mounting flange is constructed of rigid material such as heavy gauge sheet metal.

3. A mechanical interlock arrangement in accordance with claim 1 wherein top and bottom members are located traverse of the mainframe chassis with each such member including selectively located slots therein.

4. A mechanical interlock arrangement in accordance with claim 1 wherein said mounting flange is formed with said keying tab positioned at the top of said flange.

5. A mechanical interlock arrangement in accordance with claim 1 wherein said mounting flange is formed with said keying tab positioned at the bottom of said flange.

6. A mechanical interlock arrangement in accordance with claim 1 wherein said mounting flange includes a keying tab offset from the longitudinal axis of said flange.

7. A mechanical interlock arrangement in accordance with claim 1 wherein the subpanel includes at least one U-shaped handle member extending from the front thereof to facilitate insertion or removal of the subpanel assembly unit in the mainframe chassis.

8. A mechanical interlock arrangement for preventing misinstallation of a plurality of associated PC boards in a mainframe chassis of an electronic apparatus, comprising in combination:
   a subpanel with a mounting flange attached thereto to which an associated PC board is mounted to form a subpanel assembly unit, each such flange including at least one keying tab extending essentially orthogonal to the plane of said subpanel;
   guide means for guiding a PC board along a predetermined track when inserting the same within the mainframe chassis;
   first connector means located in said PC board and a corresponding second connector means located within the interior of said main frame chassis; and
   at least one member located traverse of the mainframe chassis which includes slots selectively located therein for accepting PC boards in the fully inserted position within the mainframe chassis whereby said first and second connector means are interconnected only if each such board includes a keying tab that is positioned to and mates with a corresponding slot selectively located in the mainframe chassis.

9. A mechanical interlock arrangement in accordance with claim 8 wherein said mounting flange is constructed of rigid material such as heavy gauge sheet metal.

10. A mechanical interlock arrangement in accordance with claim 8 wherein top and bottom members are located traverse of the mainframe chassis with each such member including selectively located slots therein.

11. A mechanical interlock arrangement in accordance with claim 8 wherein said mounting flange is formed with said keying tab positioned at the top of said flange.

12. A mechanical interlock arrangement in accordance with claim 8 wherein said mounting flange is formed with said keying tab positioned at the bottom of said flange.

13. A mechanical interlock arrangement in accordance with claim 8 wherein said mounting flange includes a keying tab offset from the longitudinal axis of said flange.

14. A mechanical interlock arrangement in accordance with claim 8 wherein the subpanel includes at least one U-shaped handle member extending from the front thereof to facilitate insertion or removal of the subpanel assembly unit in the mainframe chassis.

* * * * *